US007888625B2

(12) United States Patent
Holonyak, Jr. et al.

(10) Patent No.: US 7,888,625 B2
(45) Date of Patent: Feb. 15, 2011

(54) METHOD AND APPARATUS FOR PRODUCING LINEARIZED OPTICAL SIGNALS WITH A LIGHT-EMITTING TRANSISTOR

(75) Inventors: Nick Holonyak, Jr., Urbana, IL (US); Milton Feng, Champaign, IL (US); Han Wui Then, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 166 days.

(21) Appl. No.: 12/284,895

(22) Filed: Sep. 25, 2008

(65) Prior Publication Data

US 2010/0073086 A1    Mar. 25, 2010

(51) Int. Cl.
   *H01J 40/14*    (2006.01)
(52) U.S. Cl. ................. 250/214 R; 250/214 C
(58) Field of Classification Search ............. 250/214 R, 250/214 LA, 214 C; 327/514, 515, 538, 327/539, 563, 25, 43, 50, 66, 195, 196; 372/1, 372/11, 30, 38.1, 87, 19, 45; 257/80–85
See application file for complete search history.

(56) References Cited

U.S. PATENT DOCUMENTS

| 6,829,278 | B1 * | 12/2004 | Allenson et al. | ............ | 372/50.1 |
| 7,091,082 | B2 | 8/2006 | Feng et al. | .................. | 438/235 |
| 7,286,583 | B2 | 10/2007 | Feng et al. | .................... | 372/30 |
| 7,354,780 | B2 | 4/2008 | Feng et al. | .................. | 257/292 |
| 7,535,034 | B2 | 5/2009 | Walter et al. | .................. | 372/43 |
| 7,711,015 | B2 | 5/2010 | Holonyak et al. | ............. | 372/11 |
| 2003/0011010 | A1 | 1/2003 | Bosco et al. | ................. | 257/517 |
| 2005/0040432 | A1 | 2/2005 | Feng et al. | .................. | 257/198 |
| 2005/0054172 | A1 | 3/2005 | Feng et al. | .................. | 438/313 |
| 2005/0105642 | A1 | 5/2005 | Muller et al. | ................ | 375/296 |
| 2006/0208290 | A1 | 9/2006 | Feng et al. | .................. | 257/292 |
| 2007/0252651 | A1 | 11/2007 | Gao et al. | ................... | 330/302 |
| 2010/0034228 | A1 | 2/2010 | Holonyak et al. | ............. | 374/45 |

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).
Quantum-Well-Base Heterojunction Bipolar Light-Emitting Transistor, M. Feng, N. Holonyak, Jr., and R. Chan, Appl. Phys. Lett. 84, 1952 (2004).

(Continued)

*Primary Examiner*—Que T Le
(74) *Attorney, Agent, or Firm*—Martin Novack

(57) ABSTRACT

A method for producing an optical output in substantially linear relationship with an electrical AC signal, includes the following steps: providing a light-emitting transistor having emitter, base, and collector regions, and associated respective emitter, base, and collector terminals, the transistor having a light-emitting output port; applying the AC signal to a first input port defined across a given one of the terminals and a common one of the terminals; applying an amplified version of the AC signal to a second input port defined across a further one of the terminals and the common one of the input terminals; and selecting an amplification of the amplified version of the AC signal to substantially cancel a nonlinearity characteristic of the light emitting transistor.

26 Claims, 8 Drawing Sheets

OTHER PUBLICATIONS

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation Of A Heterojunction Bipolar Light-Emitting Transistor, G. Walter, N. Holonyak, Jr., M. Feng, and R. Chan, Appl. Phys. Lett. 85, 4768 (2004).

Microwave Operation And Modulation Of A Transistor Laser, R. Chan, M. Feng, N. Holonyak, Jr., and G. Walter, Appl. Phys. Lett. 86, 131114 (2005).

Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing In A Multiple Input Transistor Laser Near Threshold, M. Feng, N. Holonyak, Jr., R. Chan, A. James, and G. Walter, Appl. Phys. Lett. 88, 063509 (2006).

Collector Current Map Of Gain And Stimulated Recombination On The Base Quantum Well Transitions Of A Transistor Laser, R. Chan , N. Holonyak, Jr. , A. James , G. Walter, Appl. Phys. Lett. 88, 143508 (2006).

Collector Breakdown In The Heterojunction Bipolar Transistor laser, G. Walter, A. James, N. Holonyak, Jr., M. Feng, and R. Chan, Appl. Physics Lett. 88, 232105 (2006).

High-Speed ($\geq 1$ GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime And Modulation Bandwidth of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp In A Transistor Laser: Franz-Keldysh Reduction of The Linewidth Enhancement, G. Walter, A. James, N. Holonyak, Jr., and M. Feng, App. Phys. Lett. 90, 091109 (2007).

Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007).

Franz-Keldysh Photon-Assisted Voltage-Operated Switching of a Transistor Laser, A. James, N. Holonyak, M. Feng, and G. Walter, Photonics Technology Letters, IEEE vol. 19 Issue: 9 (2007).

Experimental Determination Of The Effective Minority Carrier Lifetime In The Operation Of A Quantum-Well n-p-n. Heterojunction Bipolar Light-Emitting Transistor Of Varying Base Quantum-Well Design and Doping; H.W. Then, M. Feng, N. Holonyak, Jr., and C. H. Wu, Appl. Phys. Lett. 91, 033505 (2007).

Charge Control Analysis Of Transistor Laser Operation, M. Feng, N. Holonyak, Jr., H. W. Then, and G. Walter, Appl. Phys. Lett. 91, 053501 (2007).

Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007).

Modulation Of High Current Gain ($\beta > 49$) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 μm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

* cited by examiner

| Terminal / Configuration | 1+ | 1− | 2+ | 2− |
|---|---|---|---|---|
| Common-emitter | Emitter | Base | Emitter | Collector |
| Common-collector | Collector | Emitter | Collector | Base |
| Common-base | Base | Emitter | Base | Collector |

FIG. 13

METHOD AND APPARATUS FOR PRODUCING LINEARIZED OPTICAL SIGNALS WITH A LIGHT-EMITTING TRANSISTOR

FIELD OF THE INVENTION

This invention relates to generation of linearized optical signals, such as for optical communication or other purpose, using a light-emitting transistor or transistor laser.

BACKGROUND OF THE INVENTION

Microwave photonic links require linear optical transmitters in order to achieve high dynamic range (typically characterized by the Spurious Free Dynamic Range or SFDR). Current optical transmitters based on directly modulated diode lasers or external modulators such as Mach-Zehnder modulators and EA (Electroabsorption) modulators, employ elaborate feedforward as well as feedback linearization techniques in order to suppress signal harmonics due to the non-linearity of diode lasers (in the case of direct modulation) and that of external modulators. Examples of such techniques are shown in FIGS. 1 and 2.

FIG. 1 illustrates an example of a feedforward dual external modulators technique. In FIG. 1, the output of diode laser 105 is coupled, by coupler 110, to an upper branch that includes polarization controller 121 and external modulator 1, which may conventionally be, for example, a mach zender modulator or an electroabsorption modulator. The modulator 1 receives an RF modulating input and bias control from a modulator bias control circuit 125. The diode laser output is also coupled, by the coupler 110, to a lower branch that includes polarization controller 131 and external modulator 2, which, again, may conventionally be a respective mach zender modulator or an electroabsorption modulator. The modulator 2 receives the RF modulating input via variable gain circuit 133, and bias control from a modulator bias control circuit 135. The outputs of the external modulators are combined by coupler 140 to produce the linearized optical output. Appropriate fiber delays are also represented in the diagram.

FIG. 2 illustrates an example of a feedforward direct modulation technique. In FIG. 2, an electrical input, such as an RF input, is split by a microwave splitter 255, one output of which is coupled to a diode laser 260, and the other output of which is coupled, via an electrical delay, to the positive input of a 180 degree hybrid coupler 270. The optical output of diode laser 260 is coupled by coupler 262 to a photodetector 275, the electrical output of which is, in turn, coupled via variable gain circuit 277, to the negative input terminal of 180 degree hybrid coupler 270. The output of coupler 270 is coupled, via an electrical delay, to another variable gain circuit 278 whose output is coupled to another diode laser 280. Another optical coupler 263 receives the output of diode laser 280 and also receives, via a fiber delay, the output of diode laser 260, and the coupler 263 combines these optical signals to produce the desired linearized optical output.

FIG. 3 illustrates an example of a feedback linearization technique. A diode laser 310, under control of a bias control circuit 305, produces an optical output that is coupled to an external modulator 320, for example of the mach-zehnder type. In this illustration, the modulator 320 receives an RF input, which may be predistorted. The optical output of modulator 320 is coupled, by optical coupler 330, to photo-diode 340, whose output controls a modulator bias control circuit 350 which, in turn, provides bias control to the modulator 320. The feedback controlled modulator output is the linearized optical output.

Advantages of feedforward over feedback techniques include the following:

1. No prior knowledge is required of the distortion or non-linear characteristics of the transmitter; and
2. There is no trade-off in speed or bandwidth of the transmitter. The feedforward technique does, however, trade-off (reduce) some linear gain.

It is among the objects of the present invention to further improve aspects of feedforward linearization techniques and systems.

SUMMARY OF THE INVENTION

Due to the two-terminal nature of diode lasers, implementation of the feedforward linearization technique requires a complex assembly of active and passive components which renders difficult, if not impossible, the task of integration for realizing a compact, single-chip solution. Such a multi-component strategy also results in excessive power consumption (e.g. greater than 2 W) and circuit complexity, leading to long fine-tuning and testing times.

As will be described, based on the two-port optical modulation of a three-port heterojunction bipolar light emitting transistor (HB LET) laser, a unique feedforward linearization system and technique can achieve, in one embodiment, a fourfold reduction in component count (e.g. from more than eight active and passive components to only two transistors), and hence may be implemented as a single-chip, integrated solution, achieving great reduction in volume, power consumption, and costs. Thus, as will be demonstrated, the advantageous performance of a feedforward linearization technique can be very efficiently realized.

In accordance with an embodiment of the technique of the invention, a method is provided for producing an optical output in substantially linear relationship with an electrical AC signal, including the following steps: providing a light-emitting transistor having emitter, base, and collector regions, and associated respective emitter, base, and collector terminals, the transistor having a light-emitting output port; applying said AC signal to a first input port defined across a given one of said terminals and a common one of said terminals; applying an amplified (i.e., as used herein, meaning amplified or attenuated) version of said AC signal to a second input port defined across a further one of said terminals and said common one of said input terminals; and selecting an amplification of said amplified version of said AC signal to substantially cancel a nonlinearity characteristic of said light emitting transistor. The amplified version of said AC signal comprises said AC signal to which a gain, G, has been applied, the gain, G, having a predetermined magnitude and phase. As indicated, the magnitude of the gain can be greater or less than unity. In a primary form of the invention, the provided light-emitting transistor is a transistor laser, and said light-emitting output port is a laser output port.

In a preferred embodiment of the invention, the step of applying an amplified version of said AC signal to said second input port comprises applying said AC signal with a gain G, where said gain G is a function of the ratio of coefficients of non-linearity associated with said first and second ports, and said gain G is also a function of modulation efficiencies associated with said first and second ports. In this embodiment, said gain G is a function of the cube root of the ratio of the products of the coefficients of non-linearity and modulation efficiencies associated with said first and second input ports.

In one embodiment of the invention, said common one of said terminals is said emitter terminal, and said given one of said terminals is said base terminal and said further one of said terminals is said collector terminal.

In another embodiment of the invention, said common one of said terminals is said base terminal, said given one of said terminals is said emitter terminal, and said further one of said terminals is said collector terminal.

In still another embodiment of the invention, said common one of said terminals is said collector terminal, said given one of said terminals is said emitter terminal, and said given one of said terminals is said base terminal.

In accordance with a further form of the invention, a feedforward linearization apparatus is set forth for producing an optical output in substantially linear relationship with an electrical AC signal, including the following: a light-emitting transistor having emitter, base, and collector regions, and associated respective emitter, base, and collector terminals, said transistor having a light-emitting output port; a first input port defined across a given one of said terminals and a common one of said terminals; a second input port defined across a further one of said terminals and said common one of said input terminals; and an amplifier coupled with said second input port; said AC signal being coupled to said first input port, and also being coupled to said second input port via said amplifier. The light-emitting transistor is preferably in an optical resonant cavity, thereby comprising a laser transistor, and the light-emitting output port is a laser output port.

In a preferred embodiment of the further form of the invention, said amplifier provides a gain, G, which has a predetermined magnitude and phase, said gain G being a function of the ratio of coefficients of non-linearity associated with said first and second ports. In a disclosed embodiment, said gain G is a function of the cube root of the ratio of coefficients of non-linearity associated with said first and second input ports.

Further features and advantages of the invention will become more readily apparent from the following detailed description when taken in conjunction with the accompanying drawings.

BRIEF DESCRIPTION OF THE DRAWINGS

FIG. 13 is a Table that shows the respective transistor regions to which terminals are coupled for each indicated configuration.

DETAILED DESCRIPTION

Figure 1:
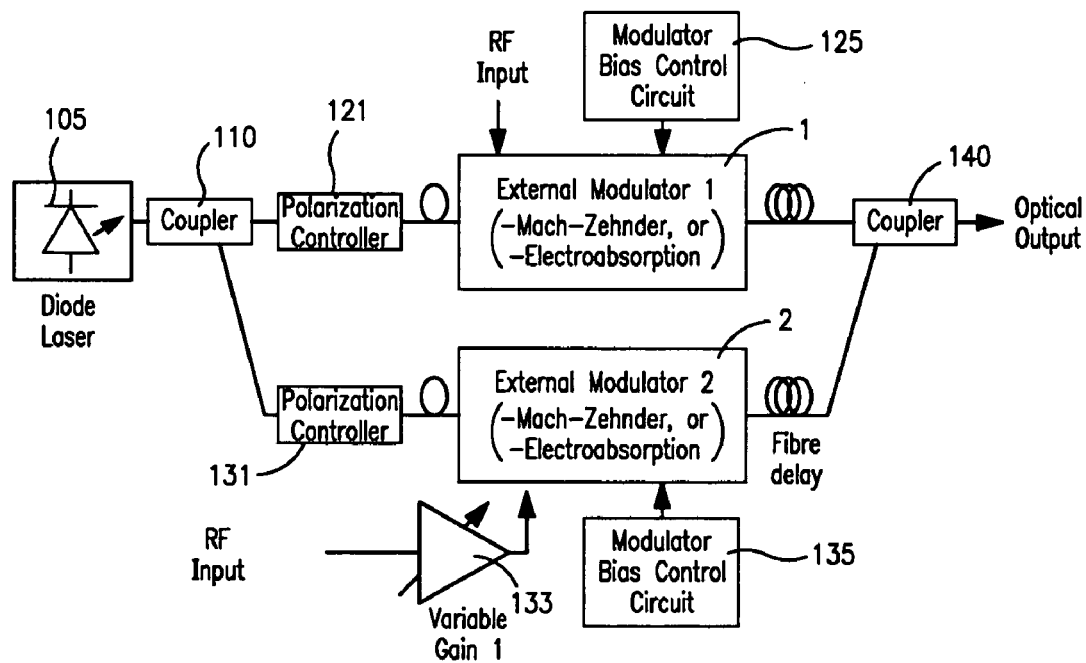
FIG. 1 shows an example of a system for implementing a known method for optical feedforward linearization of an optical output using a dual external modulators technique.
Figure 2:
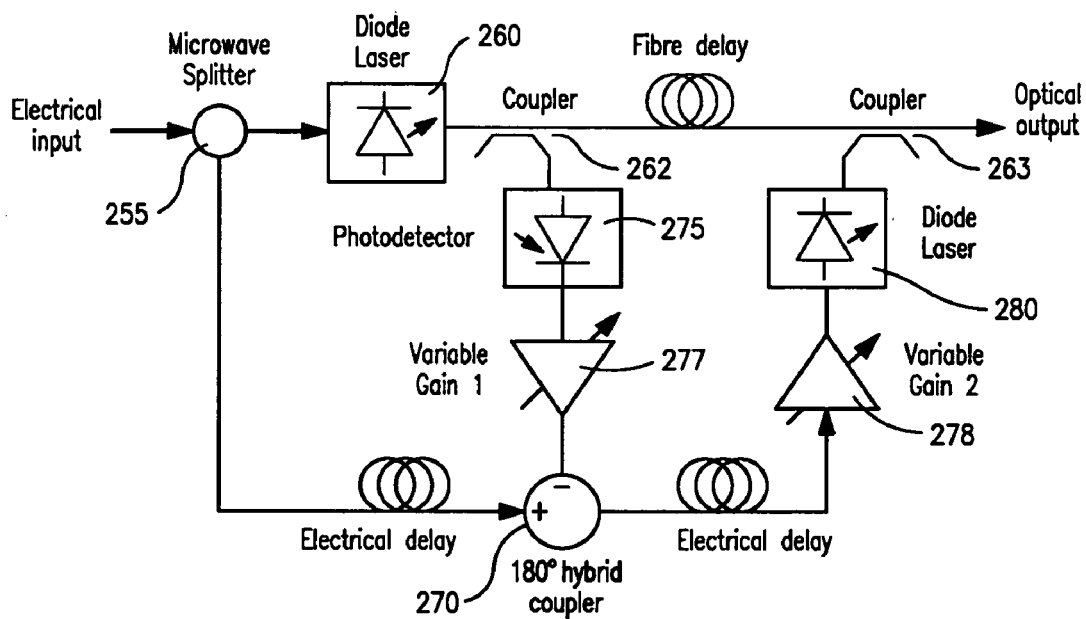
FIG. 2 shows an example of a system for implementing a known method for optical feedforward linearization of an optical output using a feedfoward direct modulation technique.
Figure 3:
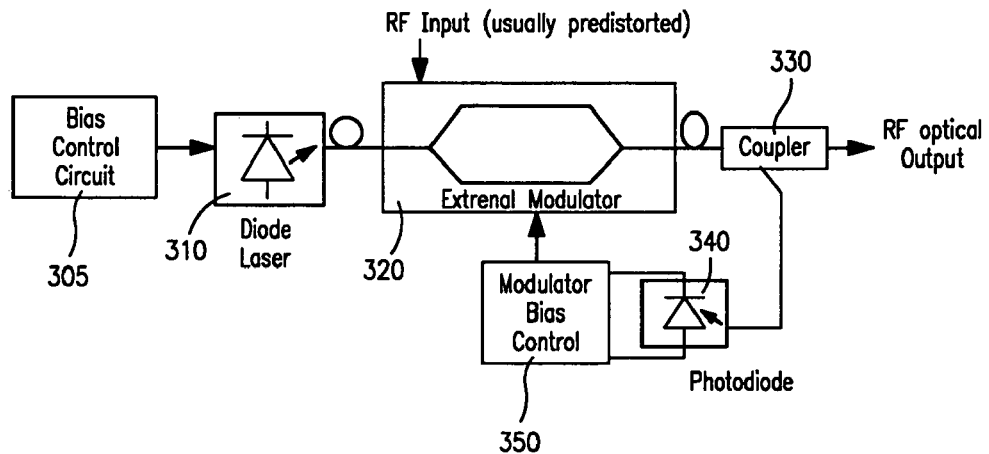
FIG. 3 shows a system for implementing a known method for linearization of an optical output using a feedback technique.
Figure 4:
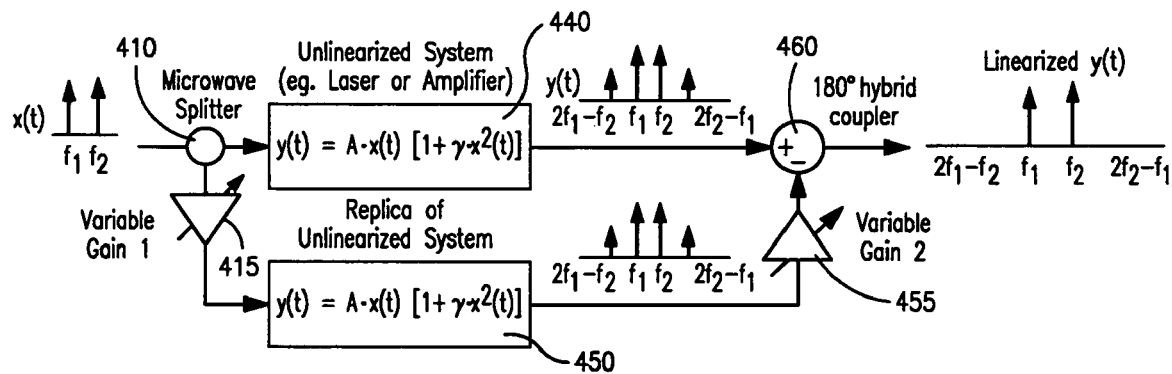
FIG. 4 illustrates the concept of feedforward linearization with harmonic cancellation using an unlinearized system and a replica of the unlinearized system.

The essential operating principles of a feedforward linearization technique are illustrated in FIG. 4. As seen in the diagram, the FIG. 4 system includes an unlinearized system 440 (such as a laser or amplifier), and a replica of the unlinearized system, 450. Also shown are microwave splitter 410 and variable gain amplifier 415. An input signal, which is this example includes frequency components $f_1$, $f_2$, is split by splitter 410, coupled to system 440, and also coupled to replica system 450 via the variable gain amplifier 415. The output of system 440 is received by the positive input of 180 degree hybrid coupler 460, and the output of replica system 450, after passing through variable gain amplifier 455, is received by the negative input of 180 degree hybrid coupler 460. The resultant difference signal, output from coupler 460, is the linearized signal, with cancellation of the harmonics $2f_1-f_2$ and $2f_2-f_1$, as shown.

In can be observed that due to the two-port nature of the system to be linearized, there is the need for the replica of the unlinearized system as well as additional components such as two variable gains and one 180° coupler for harmonic cancellation. Typically, and as seen above, optical and/or electrical delays may also be needed for fine-tuning purposes.

Embodiments of the present invention utilize heterojunction bipolar transistors which operate as light-emitting transistors and laser transistors. Reference can be made for example, to U.S. Pat. Nos. 7,091,082, 7,286,583, 7,297,589, and 7,354,780, and to the following: U.S. patent application Ser. No. 10/646,457, filed Aug. 22, 2003; U.S. patent application Ser. No. 10/861,320, filed Jun. 4, 2004; U.S. patent application Ser. No. 11/496,161, filed Jul. 31, 2006; U.S. patent application Ser. No. 11/805,859, filed May 24, 2007; U.S. patent application Ser. No. 11/974,323, filed Oct. 12, 2007; and U.S. patent application Ser. No. 12/008,796, filed Jan. 14, 2008; PCT International Patent Publication Number WO/2005/020287, published Mar. 3, 2005, and PCT International Patent Publication Number WO/2006/006879 published Aug. 9, 2006; all the foregoing being assigned to the same assignee as the present Application. Reference can also be made, for example, to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak, M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Left. 88, 063509 (2006); Collector Current Map Of Gain And Stimulated Recombination On The Base Quantum Well Transitions Of A Transistor Laser, R. Chan, N. Holonyak, Jr., A. James, G. Walter, Appl. Phys. Lett. 88, 143508 (2006); High-Speed (1 GHz) Electrical And Optical Adding, Mixing, And Processing Of Square-Wave Signals With A Transistor Laser, Milton Feng; N. Holonyak, Jr.; R. Chan; A. James; G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Left. 89, 082108 (2006); Carrier Lifetime And Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction Of The Linewidth Enhancement, G. Walter, A. James, N. Holonyak, Jr., and M. Feng Appl. Phys. Left. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Left. 90, 152109 (2007); Franz-Keldysh Photon-Assisted Voltage-Operated Switching Of A Transistor Laser, James, A.; Holonyak, N.; Feng, M.; Walter, G., Photonics Technology Letters, IEEE Volume: 19 Issue: 9 2007; Experimental Determination Of The Effective Minority Carrier Lifetime In The Operation Of A Quantum-Well n-p-n Heterojunction Bipolar Light-Emitting Transistor Of Varying Base Quantum-Well Design And Doping, H. W. Then, M. Feng, N. Holonyak, Jr., and C. H. Wu, Appl. Phys. Lett. 91, 033505 (2007); Charge Control Analysis Of Transistor Laser Operation, M. Feng, N. Holonyak, Jr., H. W. Then, and G. Walter, Appl. Phys. Lett. 91, 053501 (2007); Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007); Modulation Of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007); Collector Characteristics and The Differential Optical Gain Of A Quantum-Well Transistor Laser, H. W. Then, G. Walter, M. Feng, and N. Holonyak, Jr., Appl. Phys. Lett. 91, 243508 (2007); and Transistor Laser With Emission Wavelength At 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Figure 5:
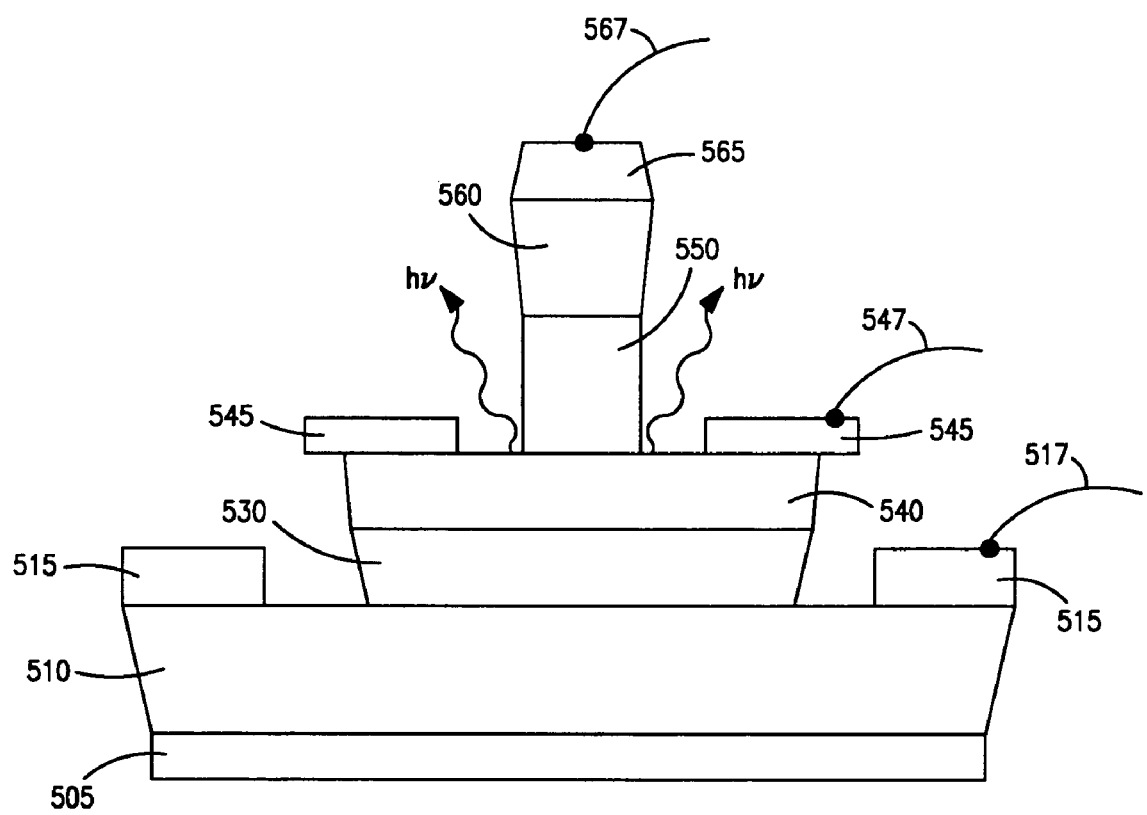
FIG. 5 is a simplified cross-sectional diagram, not to scale, of a light-emitting transistor or laser transistor, as described in referenced PCT International Patent Application Publications.

FIG. 5 illustrates a light emitting transistor device of a type described in PCT International Patent Application Publication WO/2005/020287 and in PCT International Patent Application Publication WO/2006/093883, both of these PCT Published International Patent Applications being incorporated herein by reference. A substrate 505 has the following layers disposed thereon: subcollector 510, n-type GaAs collector 530, 600 Angstrom p+ compositionally graded InGaAs base 540, n-type InGaP emitter 550, and cap layer 560. Also shown are collector metallization (or electrode) 515, base metallization 545, and emitter metallization 565. Collector lead 517, base lead 547, and emitter lead 567 are also shown. As described in the referenced PCT Published International Patent Applications, for conventional PN junction diode operation, the recombination process is based on both an electron injected from the n-side and a hole injected from the p-side, which in a bimolecular recombination process can be limited in speed. In the case of HBT light emission (as represented in FIG. 5 as light emission from base region 540) the base "hole" concentration is so high that when an electron is injected into the base, it recombines (bimolecular) rapidly. The base current merely re-supplies holes via relaxation to neutralize charge imbalance.

Figure 6:
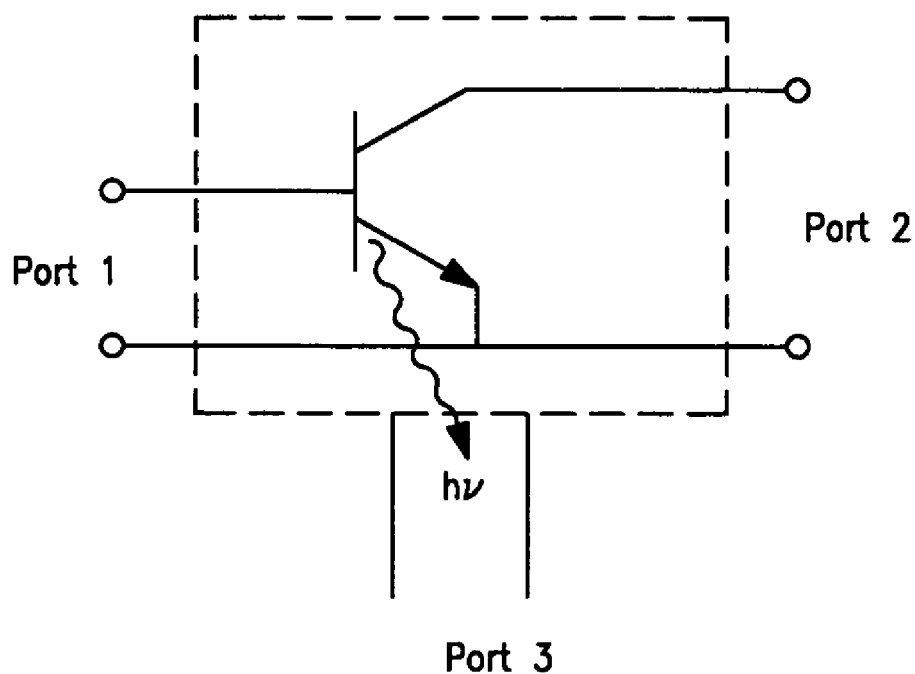
FIG. 6 is a simplified schematic diagram of a three port light-emitting transistor device as disclosed in the referenced PCT International Patent Application Publication WO/2005/020287.

As is also described in the referenced PCT International Patent Application Publications WO/2005/020287 and WO/2006/093883, in typical transistor operation, one of the three terminals of a transistor is common to both the input and output circuits. This leads to familiar configurations known as common emitter (CE), common base (CB), and common collector (CC). The common terminal (often ground reference) can be paired with one or the other of the two remaining terminals. Each pair is called a port, and two pairs for any of the configurations are called a two-port network. The two ports are usually identified as an input port and as an output port. As also described in the referenced PCT Published International Patent Applications, and as illustrated in FIG. 6, a third port, namely an optical output port, is provided, and is based on (recombination-radiation) emission from the base layer of the HBT light emitter. For the HBT of FIG. 5 operated, for example, with a common emitter configuration, when an electrical signal is applied to the input port (Port 1), there results simultaneously an electrical output with signal amplification at Port 2 and optical output with signal modulation of light emission at Port 3.

Figure 7:
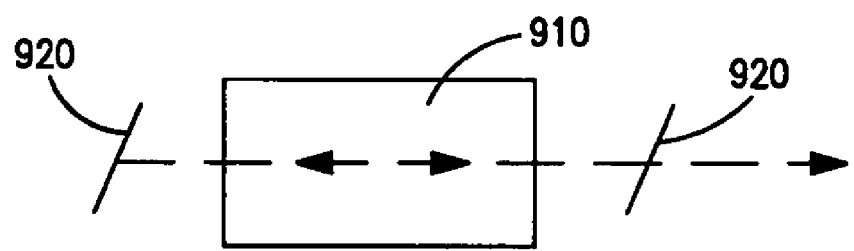
FIG. 7 illustrates reflectors used in a bipolar transistor laser device as disclosed in the referenced PCT International Patent Application Publication WO/2005/020287.

As further described in the referenced PCT International Patent Application Publications WO/2005/020287 and WO/2006/093883, FIG. 7 illustrates the three terminal light emitting HBT, 910, in a lateral optically resonant cavity, represented at 920, for operation, for example, as a lateral gain guided laser. The lateral cavity may be defined, for example, by cleaved edges on or near the light emitting region. As further described in the referenced PCT Published Patent Applications, and as will be understood throughout the present application, vertical cavity laser configurations can also be employed, using, for example, distributed Bragg reflectors (DBRs) as upper and lower optical cavity reflectors.

As also described in the referenced PCT International Patent Application Publications WO/2005/020287 and WO/2006/093883, stimulated emission can be employed to advantage in the base layer of a bipolar transistor (e.g. a bipolar junction transistor (BJT) or a heterojunction bipolar transistor (HBT), in order to enhance the speed of the transistor. Spontaneous emission recombination lifetime is a fundamental limitation of bipolar transistor speed. The base layer of a bipolar transistor is adapted to enhance stimulated emission (or stimulated recombination) to the detriment of spontaneous emission, thereby reducing recombination lifetime and increasing transistor speed. At least one layer exhibiting quantum size effects, preferably a quantum well or a layer of quantum dots, preferably undoped or lightly doped, is provided in the base layer of the bipolar transistor. Preferably, at least a portion of the base layer containing the at least one layer exhibiting quantum size effects, is highly doped, and of a wider bandgap material than said at least one layer. The at least one quantum well, or, for example, layer of quantum dots, within the higher gap highly doped material, enhances stimulated recombination and reduces radiative recombination lifetime. A two-dimensional electron gas ("2-DEG") enhances carrier concentration in the quantum well or quantum dot layer, thereby improving mobility in the base region. Improvement in base resistance permits reduction in base thickness, with attendant reduction of base transport time. These advantages in speed are applicable in high speed bipolar transistors in which light emission is utilized, and/or in high speed bipolar transistors in which light emission is not utilized. In light emitting bipolar transistor devices, for example heterojunction bipolar transistors of direct bandgap materials, the use of one or more layers exhibiting quantum size effects can also be advantageous in enhancing light emission and customizing the emission wavelength characteristics of the devices. Doped or highly doped quantum size regions can also be utilized.

Figure 8:
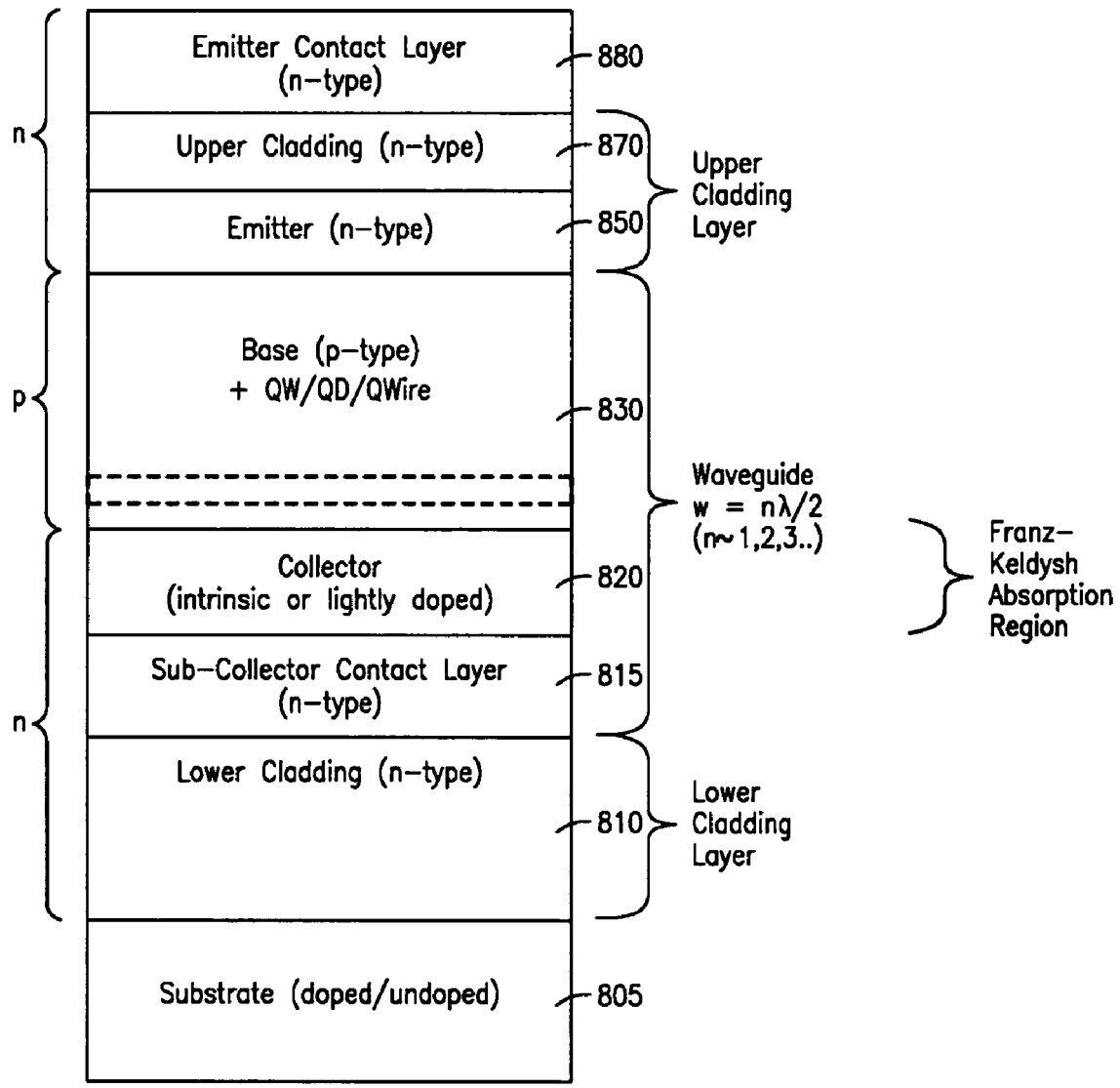
FIG. 8 is a diagram, not to scale, of the epitaxial layer structure of a type of device that can be utilized in practicing embodiments of the invention.

FIG. 8 shows the general epitaxial layers of a type of device that can be utilized in practicing embodiments and techniques hereof, and which can be modified to implement other embodiments and techniques hereof. Reference can also be made, for example, to copending U.S. patent application Ser. No. 11/805,859, filed May 24, 2007, and assigned to the same assignee as the present Application. In the simplified device diagram of FIG. 8, a substrate, which may be doped or undoped, is represented at 805, and has the following layers disposed thereon. A lower cladding layer, which is n-type in this example (it being understood, throughout, that, where suitable, devices of opposite conductivity type can be employed), is represented at 810. Then, an n-type sub-collector contact layer is represented at 815, and an intrinsic or lightly doped n-type collector layer is represented at 820. Next, a p-type base region, which preferably exhibits quantum size effects (e.g. by virtue of its own dimensions and/or by inclusion of one or more quantum well(s) and/or layer(s) of quantum dots and/or quantum wires), is represented at 830. Disposed thereon are n-type emitter 850, n-type upper cladding 870, and an n-type emitter contact layer, represented at 880. Contacts and leads for application of signals are applied to the sub-collector contact layer 815, the base layer 830, and the emitter contact layer 880. For operation as a laser, an optical resonant cavity is provided, as previously set forth.

Figure 9:
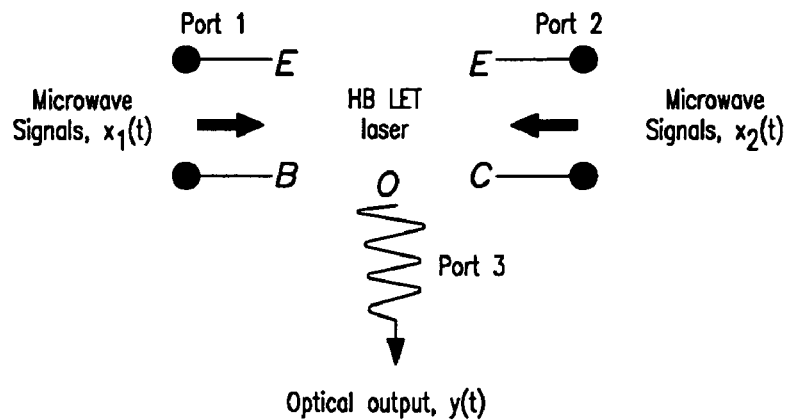
FIG. 9 shows a light-emitting transistor or a transistor laser in common emitter configuration, with two electrical input ports and an optical output port.

As has been described, the heterojunction bipolar light-emitting transistor (HBLET) is a three-port device (2 electrical ports and 1 optical port), which, when incorporated with a suitable photon resonator cavity, can operate in laser mode. As shown in FIG. 9, its optical output may be modulated, for example, by a microwave signal input to Electrical Port 1 or to Electrical Port 2, or concurrently to both Ports 1 and 2. The HBLET of FIG. 9 is represented as being in common-emitter configuration where Port 1 is the Base-Emitter and Port 2 is the Collector-Emitter. As also described herein, configurations, such as common-base and common-collector, are also realizable. The input to Port 1 is designated $x_2(t)$ and the input to Port 2 is designated $x_2(t)$.

Due to its three-port nature, and concurrent Port 1- and Port 2-modulation capability, and as will be demonstrated further herein, the HBLET laser can be employed in a special way to implement the feedforward linearization scheme at the level of a single-device, hence achieving an unprecedented compact and integrated form.

Figure 10:
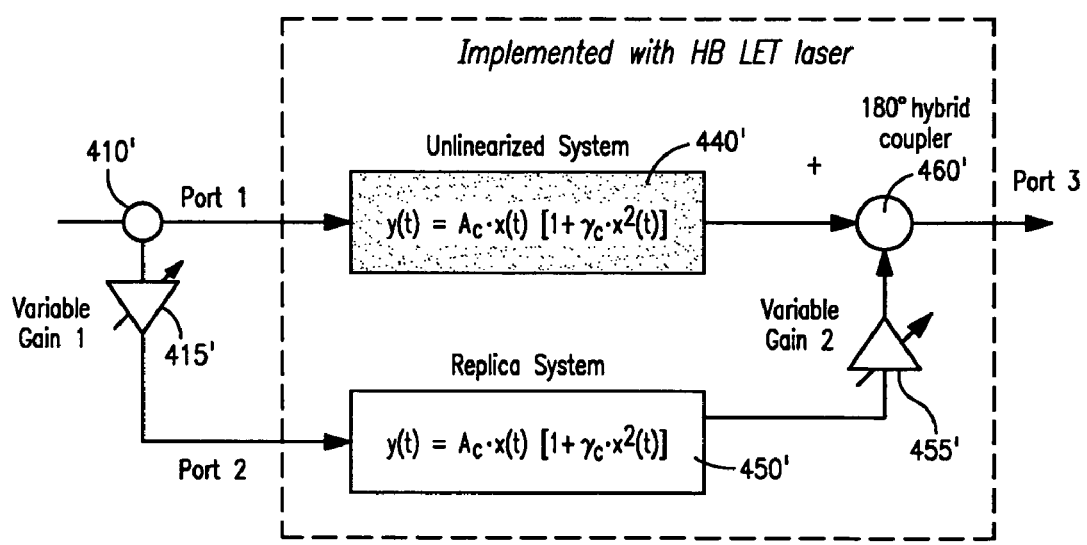
FIG. 10 is a block diagram identifying functional blocks of a feedforward linearization technique of a type that can be implemented with a transistor laser in accordance with an embodiment of the invention.

In FIG. 10, the functional blocks of a feedforward linearization scheme, that may be implemented at the single-device level with an HBLET laser, are identified. (The reference numerals, with primes added, denote conceptually elements corresponding to those of FIG. 4 with like reference numerals.) For example, in the common-emitter configuration, the optical output response to Port 1 ($V_{BE}$) modulation is fundamentally not the same as that of Port 2 ($V_{CE}$) modulation due to involvement of different underlying physical processes. Port 1 ($V_{BE}$) modulation is a direct current injection process whereby the injected emitter current, hence the base electron-hole recombination current which forms coherent photons giving the laser signal, is modulated directly. Port 2 ($V_{CE}$) modulation involves both $V_{BE}$- and $V_{CB}$-modulation (since $V_{CE}=V_{CB}+V_{BE}$). $V_{CB}$-modulation is an electroabsorption (or Franz-Keldysh) process at the reverse-biased base-collector junction. In a transistor laser, both processes occur in a single photon resonator cavity (i.e., the cavity of the transistor laser).

The optical output response to Port 1 and Port 2 modulation may then be characterized by two non-linear $3^{rd}$ order polynomials with different linear gains (modulation efficiencies), $A_b$ and $A_c$, and $3^{rd}$ order non-linear coefficients, $\gamma_b$ and $\gamma_c$, respectively.

Figure 11:
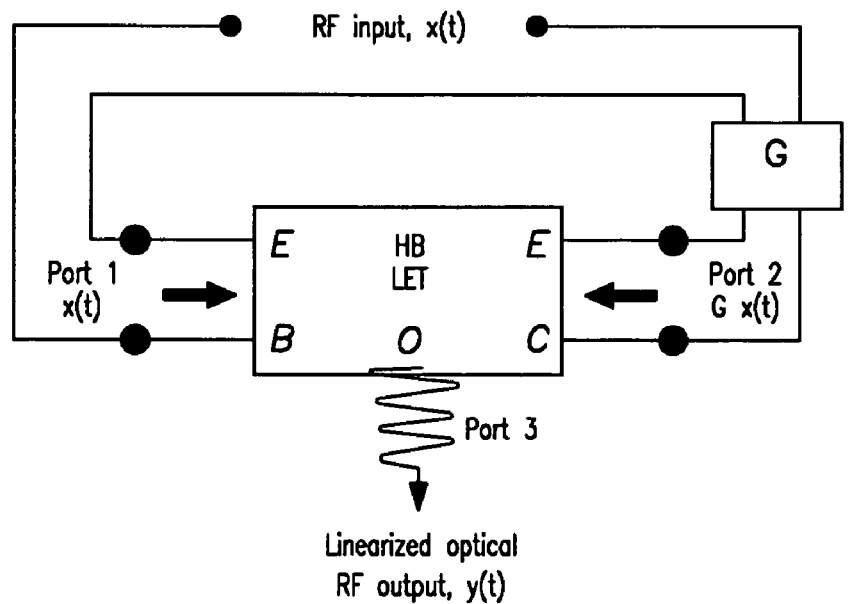
FIG. 11 is a schematic representation of implementation of feedforward linearization of an optical output using a technique in accordance with an embodiment of the invention, employing a common emitter configuration.

In accordance with a feature of an embodiment of the invention, a feedforward linearization system and technique is implemented by feeding Port 1 with rf input, x(t) while feeding the Port 2 concurrently with the same rf input with an appropriate gain, G, of selected amplitude and phase to cause the non-linearity (e.g., intermodulation products) in the responses to cancel. As is shown below, the desired optical output that is linear in relationship with the applied electrical AC signal does not cancel. However, the resultant total (effective) linear gain due to the concurrent two-port modulation will be reduced. FIG. 11 shows this in schematic form. The input to electrical Port 1 is x(t) and the input to electrical Port 2 is Gx(t). The output of optical Port 3 is the optical rf output, which is linearized, as can be seen as follows:

Port 1-modulation: $y_b(t)=A_b x(t)\{1+\gamma_b x^2(t)\}$

Figure 12:
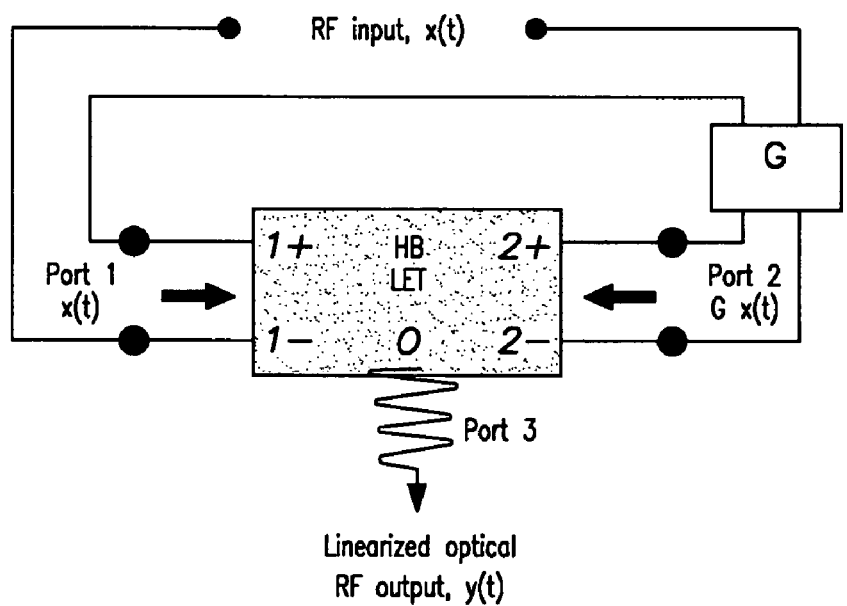
FIG. 12 shows a generalized circuit representation of embodiments of the invention, for common emitter, common collector, and common base configurations.

Port-2-modulation: $y_c(t)=A_c Gx(t)\{1+\gamma_c G^2 x^2(t)\}$ $y(t)=y_b(t)+y_c(t)$ $y(t)=[A_b+GA_c]x(t)+[A_b\gamma_b+A_c\gamma_c G^3]x^3(t)$ For perfect cancellation of $3^{rd}$ order non-linearity, gain G is chosen such that $A_b\gamma_b+A_c\gamma_c G^3=0$ or $G=-\{A_b\gamma_b/A_c\gamma_c\}^{1/3}$ There will be a trade-off in the form of reduced total linear gain, $A_b+GA_c=A_b-\{A_b\gamma_b/A_c\gamma_c\}^{1/3}A_c$ While FIG. 11 shows a common emitter configuration, it will be understood that common collector and common base configurations can alternatively be employed. The generalized circuit is for all three configurations is shown in FIG. 12, in which the Port 1 terminals are denoted 1+ and 1−, and the Port 2 terminals are denoted 2+ and 2−. The terminals 1+ and 2+ are the common terminals. The table of FIG. 10 shows the respective laser transistor regions (emitter, collector, or base) to which the terminals are coupled for each configuration. The generalized equations for Port 1 and Port 2 modulation are as follows:

Port 1-modulation: $y_1(t)=A_1 x(t)\{1+\gamma_1 x^2(t)\}$

Port 2-modulation: $y_2(t)=A_2 Gx(t)\{1+\gamma_2 G^2 x^2(t)\}$ $y(t)=y_1(t)+y_2(t)$ $y(t)=[A_1+GA_2]x(t)+[A_1\gamma_1+A_2\gamma_2 G^3]x^3(t)$ where the subscripts 1 and 2 refer to Port 1 and 2 respectively.

For perfect cancellation of $3^{rd}$ order non-linearity, gain G is chosen such that $A_1\gamma_1+A_2\gamma_2 G^3=0$ or $G=-\{A_1\gamma_1/A_2\gamma_2\}^{1/3}$ There will be a trade-off in the form of reduced total linear gain, $A_1+GA_2=A_1-\{A_1\gamma_1/A_2\gamma_2\}^{1/3}A_2$ Based on the two-port optical modulation of a three-port heterojunction bipolar light emitting transistor (HB LET)

laser, the unique feedforward linearization system and technique hereof achieves, in the exemplary embodiment, a fourfold reduction in component count (that is, from more than eight active and passive components to only two transistors—namely, the transistor laser and a transistor to implement the gain function). Hence, the system may be implemented as a single-chip, integrated solution, thereby achieving great reduction in volume, power consumption, and costs.

The invention claimed is:

1. A method for producing an optical output in substantially linear relationship with an electrical AC signal, comprising the steps of:
    providing a light-emitting transistor having emitter, base, and collector regions, and associated respective emitter, base, and collector terminals, said transistor having a light-emitting output port;
    applying said AC signal to a first input port defined across a given one of said terminals and a common one of said terminals;
    applying an amplified version of said AC signal to a second input port defined across a further one of said terminals and said common one of said input terminals; and
    selecting an amplification of said amplified version of said AC signal to substantially cancel a nonlinearity characteristic of said light emitting transistor.

2. The method as defined by claim 1, wherein said amplified version of said AC signal comprises said AC signal to which a gain, G, has been applied.

3. The method as defined by claim 2, wherein the gain, G, has a predetermined magnitude and phase.

4. The method as defined by claim 1, wherein said step of applying an amplified version of said AC signal to said second input port comprises applying said AC signal with a gain G, where said gain G is a function of the ratio of coefficients of non-linearity associated with said first and second ports.

5. The method as defined by claim 4, wherein said gain G is also a function of the modulation efficiencies associated with said first and second ports.

6. The method as defined by claim 4, wherein said gain G is a function of the cube root of the ratio of the products of the coefficients of non-linearity and modulation efficiencies associated with said first and second input ports.

7. The method as defined by claim 5, wherein said gain G is a function of the cube root of the ratio of the products of the coefficients of non-linearity and modulation efficiencies associated with said first and second input ports.

8. The method as defined by claim 1, wherein said common one of said terminals is said emitter terminal.

9. The method as defined by claim 8, wherein said given one of said terminals is said base terminal and said further one of said terminals is said collector terminal.

10. The method as defined by claim 1, wherein said common one of said terminals is said base terminal.

11. The method as defined by claim 10, wherein said given one of said terminals is said emitter terminal and said further one of said terminals is said collector terminal.

12. The method as defined by claim 1, wherein said common one of said terminals is said collector terminal.

13. The method as defined by claim 12, wherein said given one of said terminals is said emitter terminal and said further one of said terminals is said base terminal.

14. The method as defined by claim 1, wherein said step of providing a light-emitting transistor comprises providing a transistor laser, and wherein said light-emitting output port is a laser output port.

15. The method as defined by claim 5, wherein said step of providing a light-emitting transistor comprises providing a transistor laser, and wherein said light-emitting output port is a laser output port.

16. A feedforward linearization apparatus for producing an optical output in substantially linear relationship with an electrical AC signal, comprising:
    a light-emitting transistor having emitter, base, and collector regions, and associated respective emitter, base, and collector terminals, said transistor having a light-emitting output port;
    a first input port defined across a given one of said terminals and a common one of said terminals;
    a second input port defined across a further one of said terminals and said common one of said input terminals; and
    an amplifier coupled with said second input port;
    said AC signal being coupled to said first input port, and also being coupled to said second input port via said amplifier.

17. The feedforward linearization apparatus as defined by claim 16, wherein said amplifier provides a gain, G, which has a predetermined magnitude and phase.

18. The feedforward linearization apparatus as defined by claim 4, wherein said gain G is also a function of the modulation efficiencies associated with said first and second ports.

19. The feedforward linearization apparatus as defined by claim 18, wherein said gain G is a function of the ratio of coefficients of non-linearity associated with said first and second ports.

20. The feedforward linearization apparatus as defined by claim 19, wherein said gain G is a function of the cube root of the ratio of the products of the coefficients of non-linearity and modulation efficiencies associated with said first and second input ports.

21. The feedforward linearization apparatus as defined by claim 18, wherein said gain G is a function of the cube root of the ratio of the products of the coefficients of non-linearity and modulation efficiencies associated with said first and second input ports.

22. The feedforward linearization apparatus as defined by claim 16, wherein said common one of said terminals is said emitter terminal.

23. The feedforward linearization apparatus as defined by claim 14, wherein said given one of said terminals is said base terminal and said further one of said terminals is said collector terminal.

24. The feedforward linearization apparatus as defined by claim 14, wherein said common one of said terminals is said base terminal.

25. The feedforward linearization apparatus as defined by claim 14, wherein said common one of said terminals is said collector terminal.

26. The feedforward linearization apparatus as defined by claim 14, wherein said light-emitting transistor comprises a transistor laser, and wherein said light-emitting output port comprises a laser output port.

* * * * *